United States Patent [19]

De With

[11] Patent Number: 4,983,572

[45] Date of Patent: Jan. 8, 1991

[54] SUPERCONDUCTIVE BODY

[75] Inventor: Gijsbertus De With, Eindhoven, Netherlands

[73] Assignee: U.S. Philips Corporation, New York, N.Y.

[21] Appl. No.: 236,589

[22] Filed: Aug. 25, 1988

[30] Foreign Application Priority Data

Sep. 2, 1987 [NL] Netherlands .......................... 8702059

[51] Int. Cl.$^5$ ............................................ H01B 12/00
[52] U.S. Cl. ....................................... 505/1; 505/807; 505/809; 505/818; 505/823; 419/10; 419/20; 419/21; 419/24; 419/26; 419/35; 419/48; 419/57; 75/235; 75/229
[58] Field of Search ................ 505/809, 823, 807, 818, 505/1; 419/10, 20, 21, 24, 26, 35, 48, 57; 75/235, 229

[56] References Cited

U.S. PATENT DOCUMENTS 4,826,808  5/1989  Yurek et al. ............................. 505/1
4,892,861  1/1990  Ray ......................................... 505/1

FOREIGN PATENT DOCUMENTS 0300215  1/1989  European Pat. Off. .

Primary Examiner—Stephen J. Lechert, Jr.
Assistant Examiner—Nina Bhat
Attorney, Agent, or Firm—Norman N. Spain

[57] ABSTRACT

A superconductive body of an oxidic superconductive material having good mechanical properties is characterized in that the oxidic material forms a matrix through which finely divided particles are mixed at least the surface of which consists of a metal or a metal alloy. Particles in the form of fibres are preferably used and the surface of the particles consists of silver or gold.

5 Claims, No Drawings

SUPERCONDUCTIVE BODY

BACKGROUND OF THE INVENTION

The invention relates to a superconductive body of an oxidic superconductive material.

An oxidic superconductive material which comprises Ba, La, Cu and O is described in an article by J.G. Bednorz and K.A. Müller in Z.Phys.B - Condensed Matter 64, pp. 189-193 (1986). Ba may be replaced, for example, by Sr. The material described is superconductive at temperatures below a transition temperature $T_C$ of approximately 40K.

A superconductive material of the composition $YBa_2Cu_3O_{7-\delta}$ wherein $\delta$ has a value, for example, from 0 to 1, is described in an article by P.M. Grant et al. in Physical Review B, 35 (13), pp. 7242-7244 (1987). This material in which Y may be replaced inter alia by La and rare earth metals and in which Ba may be replaced, for example, by Sr, is superconductive at temperatures below $T_c \approx 90K$. Oxygen may be replaced partly by fluorine which results in an increase of $T_c$.

These oxidic superconductive materials are characterized by having a high value of the transition temperature $T_c$, which increases their usefulness However less favorable properties have impeded a wide application of these materials so far, especially when it relates to applications in which the superconductive material is not used in the form of a thin layer on a carrier. The critical current density, i.e. the current density above which the material is no longer superconductive, is too low for many applications. The resistance to moisture also is not satisfactory. The mechanical properties in particular are bad. The materials are brittle, have a low tear resistance and strength and a poor aging behaviour.

SUMMARY OF THE INVENTION

It is the object of the invention to provide a superconductive material having improved mechanical properties and an increased critical current density in which the transition temperature $T_c$ maintains the desired high value.

According to the invention this object is achieved by a superconductive material as described in the opening paragraph in which the oxidic material forms a matrix through which particles in a finely divided form are mixed at least the surface of the particles consisting of a metal or a metal alloy. The term "metal" is to be understood to include hereinafter also metal alloys.

An additional advantage of such a material is that a good thermal and current conductivity remains when the superconductive behaviour is suppressed in some way or another, for example, by an increase in temperature. This protective effect is achieved in particular with a high filling degree of the composite material in which, for example, up to 40% by volume of particles may be used.

DETAILED DESCRIPTION OF THE INVENTION

The particles used consist, for example, of a core of a ceramic material and a cladding of a metal with which it is achieved that the particles show a coefficient of expansion which is adapted to that of the matrix material. The coefficient of expansion of $YBa_2Cu_3O_{7-\delta}$ in the orthorhombic superconductive form is approximately $13.10^{-6}/°C$.

In an alternative embodiment the particles consist entirely of one or more metals. Such particles are particularly suitable to be loaded for tensile strength. When metal particles are used the coefficient of expansion is not particularly critical because metals are plastically deformable.

Organic bonding layers may not be provided on the particles because they cannot withstand the high temperature at which the sintering of the matrix material takes place and because the remaining parts may influence the composition of the superconductive material unfavourably.

The particles used may be, for example, in the form of spheres or flakes. In a preferred embodiment of the material according to the invention particles are used in the form of fibres with which particularly good mechanical properties are obtained. The fibres preferably have a length smaller than 2 mm and a diameter from 5 to 100 $\mu$m. Fibres may be used in various manners, for example, arbitrarily oriented or in an oriented form. For example, fibres are used of a ductile material, which is not damaged during mixing and which is reinforced by means of a precipitation hardening during the sintering of the matrix material.

In order to prevent a reaction of the metal with the superconductive material particles are preferably used the surface of which consists of a metal which is selected from the group consisting of silver and gold. Herewith it is prevented that the oxygen contents and the valency of the copper ions in the superconductive material are disturbed. Both are of importance for the superconductive behaviour and for the high value of the transition temperature $T_c$. The choice of silver and gold is determined by the fact that the said metals do not react with the superconductive material. The affinity to oxygen is low and said metals are not multivalent so that the valency of the copper ions is not influenced. Fibres of the comparatively soft metals gold and silver may be used efficaciously because said metals increase the ductility of the composite material. In a particularly suitable embodiment of the material according to the invention particles are used in the form of fibres of an iron-nickel-chromium alloy having a cladding of silver or gold. Such alloys may optionally comprise other elements, for example, Mo and C.

A superconductive material which consists of a porous ceramic material in which wires of a superconductive metal are provided in the pores is described in German Patent Specification DE 1302007. In that case the matrix is not superconductive. Such a structure has no particularly favourable mechanical properties and is used only because a large magnetic field can be applied without loss of superconductive behaviour.

The invention will now be described in greater detail with reference to the following example.

EXAMPLE

According to this example, metal fibres are used having an average length of approximately 1 mm and an average diameter of approximately 8 $\mu$m. The fibres consist of 22% by weight of Cr, 18% by weight of Fe, 48% by weight of Ni, 9% by weight of Mo, balance C, Co and W. The coefficient of expansion of the said alloy is approximately $12.10^{-6}/°C$. The fibres are coated with a dense cladding of silver in a thickness of approximately 1 $\mu$m.

The metal fibres are washed in water and then dried and sieved through a sieve having meshes of 1.5 mm. A mixture is made of 30% by volume of metal fibres and 70% by volume of $YBa_2Cu_3O_{6.7}$.

60 g of the materials to be mixed and 120 g of butanone are mixed intimately in a coffee mill for 5 seconds. The mixture is then scraped from the walls of the coffee mill and mixed for another 5 seconds. The selected times are short so as to prevent fracture of the metal fibres as much as possible.

The resulting mass is dried. A cake is formed which is broken and reduced to a coarse powder by means of a sieve having meshes of 1.5 mm. The powder consists of grains which comprise both metal fibres and ceramic particles.

The powder is brought in a synthetic resin mould, for example of polymethylmethacrylate, in the form of layers of 5 mm thickness which are always smoothed before the next layer is provided, by which procedure the formation of cavities should be prevented. The powder is then compressed to the desired shape while using a pressure of $10^7$ to $5.10^7$ Pa depending on the dimensions of the product.

The intermediate product is then densified by means of isostatic compression in an oil vessel, the product being carefully packaged so as to avoid direct contact with the oil. The pressure is $5.10^8$ Pa.

The product is finally hot-pressed in a nitrogen atmosphere at a pressure of $7.10^7$ Pa. The heating rate is 200° C./h and the product is kept at a peak temperature of 950° C. for 15 minutes. This step, in which sintering occurs is carried out in an as short as possible period of time so as to prevent damage of the metal fibres.

The product is cooled slowly in an oxygen atmosphere, which is necessary to ensure that the correct quantity of oxygen is present in the superconductive material.

The resulting material has good mechanical properties and is very homogeneous with which it is achieved that the critical current density has a high value.

What is claimed is:

1. A superconductive body comprising a matrix consisting essentially of an oxidic superconductive material in which there are mixed finely divided particles which parrticles consist of a core of a ceramic material and a cladding of metal.

2. A superconductive body of claim 1 wherein the particles are fiber shaped.

3. A superconductive body as claimed in claim 1, in which the surface of the particles consists of a metal which is selected from the group consisting of silver and gold.

4. A superconductive body as claimed in claim 2, in which the particles are fibers having a length smaller than 2 mm and a diameter from 5 to 100 μm.

5. A superconductive body comprising a matrix consisting essentially of an oxidic superconductive material in which there are mixed finely divided particle which particles consist of fibers of an iron-nickel-chromium alloy with a cladding of silver or gold.

* * * * *